United States Patent
Nakano

(10) Patent No.: US 9,024,329 B2
(45) Date of Patent: May 5, 2015

(54) SILICON CARBIDE TRENCH MOSFET HAVING REDUCED ON-RESISTANCE, INCREASED DIELECTRIC WITHSTAND VOLTAGE, AND REDUCED THRESHOLD VOLTAGE

(71) Applicant: Rohm Co., Ltd., Kyoto-shi, Kyoto (JP)

(72) Inventor: Yuki Nakano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/049,810

(22) Filed: Oct. 9, 2013

(65) Prior Publication Data
US 2014/0034969 A1    Feb. 6, 2014

Related U.S. Application Data

(63) Continuation of application No. 12/993,209, filed as application No. PCT/JP2009/059257 on May 20, 2009, now Pat. No. 8,575,622.

(30) Foreign Application Priority Data

May 20, 2008    (JP) .................................. 2008-131884

(51) Int. Cl.
*H01L 29/15*    (2006.01)
*H01L 31/0312*    (2006.01)
(Continued)

(52) U.S. Cl.
CPC ......... *H01L 29/7813* (2013.01); *H01L 29/0634* (2013.01); *H01L 29/1095* (2013.01); *H01L29/1608* (2013.01); *H01L 29/66068* (2013.01); *H01L 29/7397* (2013.01); *H01L 29/42368* (2013.01); *H01L 29/45* (2013.01)

(58) Field of Classification Search
CPC ............ H01L 29/1095; H01L 29/1608; H01L 29/66068; H01L 29/7397; H01L 29/7813; H01L 29/45; H01L 29/0634; H01L 29/42368

USPC ............................................. 257/77, E29.262
See application file for complete search history.

(56) References Cited

U.S. PATENT DOCUMENTS

| 5,742,076 A | 4/1998 | Sridevan et al. |
| 6,495,871 B2 | 12/2002 | Hattori |

(Continued)

FOREIGN PATENT DOCUMENTS

| JP | 2001-250947 | 9/2001 |
| JP | 2003-51598 | 2/2003 |

(Continued)

OTHER PUBLICATIONS

Tsui et al. "Trench Gate Power MOSFETs with Retrograde Body Profile". *Proceedings of 2004 International Symposium on Power Semiconductor Devices & IC's*, Kitakyushu, p. 213-216 (2004).

(Continued)

*Primary Examiner* — Stephen W Smoot
*Assistant Examiner* — Vicki B Booker
(74) *Attorney, Agent, or Firm* — Hamre, Schumann, Mueller & Larson, P.C.

(57) ABSTRACT

A semiconductor device (A1) includes a first n-type semiconductor layer (11), a second n-type semiconductor layer (12), a p-type semiconductor layer (13), a trench (3), an insulating layer (5), a gate electrode (41), and an n-type semiconductor region (14). The p-type semiconductor layer (13) includes a channel region that is along the trench (3) and in contact with the second n-type semiconductor layer (12) and the n-type semiconductor region (14). The size of the channel region in the depth direction x is 0.1 to 0.5 μm. The channel region includes a high-concentration region where the peak impurity concentration is approximately $1 \times 10^{18}$ cm$^{-3}$. The semiconductor device A1 thus configured allows achieving desirable values of on-resistance, dielectric withstand voltage and threshold voltage.

20 Claims, 10 Drawing Sheets

(51) Int. Cl.
*H01L 29/78* (2006.01)
*H01L 29/10* (2006.01)
*H01L 29/16* (2006.01)
*H01L 29/66* (2006.01)
*H01L 29/739* (2006.01)
*H01L 29/06* (2006.01)
*H01L 29/423* (2006.01)
*H01L 29/45* (2006.01)

(56) References Cited

U.S. PATENT DOCUMENTS

| | | |
|---|---|---|
| 6,919,599 B2 | 7/2005 | Henson |
| 7,692,239 B2 | 4/2010 | Nagaoka |
| 2006/0054970 A1 | 3/2006 | Yanagida et al. |

FOREIGN PATENT DOCUMENTS

| | | |
|---|---|---|
| JP | 2004-335990 | 11/2004 |
| JP | 2005-5655 | 1/2005 |
| JP | 2006-32420 | 2/2006 |
| JP | 2006-80177 | 3/2006 |
| JP | 2007-157751 | 6/2007 |
| JP | 2007-281265 | 10/2007 |

OTHER PUBLICATIONS

Otake et al. "GaN-Based Trench Gate Metal Oxide Semiconductor Field Effect Transistors with Over 100 $cm^2$/(Vs) Channel Mobility". *Japanese Journal of Applied Physics*, vol. 46, No. 25, pp. L599-L601 (2007).

SILICON CARBIDE TRENCH MOSFET HAVING REDUCED ON-RESISTANCE, INCREASED DIELECTRIC WITHSTAND VOLTAGE, AND REDUCED THRESHOLD VOLTAGE

This application is a Continuation of U.S. Ser. No. 12/993,209, filed Nov. 17, 2010, which is a National Stage Application of PCT/JP2009/059257, filed May 20, 2009 and issued as U.S. Pat. No. 8,575,622, which applications are incorporated herein by reference.

TECHNICAL FIELD

The present invention relates to a semiconductor device having a trench structure.

BACKGROUND ART

FIG. 9 shows an example of a conventional vertical insulated-gate semiconductor device having a trench structure. The semiconductor device 9A shown in the figure includes a first n-type semiconductor layer 911, a second n-type semiconductor layer 912, a p-type semiconductor layer 913, an n-type semiconductor region 914, a trench 93, a gate electrode 94 and a gate insulating layer 95.

The first n-type semiconductor layer 911 serves as a base of the semiconductor device 9A. The second n-type semiconductor layer 912, the p-type semiconductor layer 913, and the n-type semiconductor region 914 are stacked on the first n-type semiconductor layer 911.

The trench 93 is formed so as to penetrate through the p-type semiconductor layer 913 and the n-type semiconductor region 914 to reach the second n-type semiconductor layer 912. Inside the trench 93, the gate electrode 94 and the gate insulating layer 95 are provided. The gate insulating layer 95 insulates the gate electrode 94 from the second n-type semiconductor layer 912, the p-type semiconductor layer 913 and the n-type semiconductor region 914. The gate insulating layer 95 is formed along the inner surface of the trench 93.

The p-type semiconductor layer 913 includes a channel region. The channel region is along the trench 93 and in contact with the second n-type semiconductor layer 912 and the n-type semiconductor region 914.

Regarding the semiconductor device 9A thus configured, it is preferable that the on-resistance is low from the viewpoint of reducing energy loss. To prevent dielectric breakdown, it is preferable that the dielectric withstand voltage is high. Also, there is a demand for a reduced threshold voltage so that the semiconductor device can be driven by applying a relatively low voltage to the gate electrode (see Patent Document 1, for example).

Patent Document 1: JP-A-2006-32420

DISCLOSURE OF THE INVENTION

Problems to be Solved by the Invention

The present invention has been proposed under the foregoing circumstances. It is an object of the present invention to provide a semiconductor device that allows reducing the on-resistance, increasing the dielectric withstand voltage and reducing the threshold voltage.

Means for Solving the Problems

A semiconductor device provided according to the present invention includes a first semiconductor layer having a first conductivity type, a second semiconductor layer provided on the first semiconductor layer and having a second conductivity type opposite to the first conductivity type, a trench penetrating through the second semiconductor layer to reach the first semiconductor layer, an insulating layer formed at a bottom and a side of the trench along an inner surface of the trench, a gate electrode which is insulated by the insulating layer from the first semiconductor layer and the second semiconductor layer and at least part of which is formed inside the trench, and a semiconductor region having the first conductivity type and formed around the trench on the second semiconductor layer. The second semiconductor layer includes a channel region that is along the trench and in contact with the first semiconductor layer and the semiconductor region. The size of the channel region in a depth direction of the trench is 0.1 to 0.5 μm, and the peak impurity concentration of the channel region is in a range of $4 \times 10^{17}$ cm$^{-3}$ to $2 \times 10^{18}$ cm$^{-3}$.

In a preferred embodiment of the present invention, the channel region includes a high-concentration region where impurity concentration is equal to or higher than $5 \times 10^{17}$ cm$^{-3}$. The high-concentration region is in the form of a layer that is in contact with the trench and that spreads in a direction perpendicular to the depth direction.

In a preferred embodiment of the present invention, the second semiconductor layer and the semiconductor region are made of silicon carbide.

Other features and advantages of the present invention will become more apparent from detailed description given below with reference to the accompanying drawings.

BEST MODE FOR CARRYING OUT THE INVENTION

Preferred embodiments of the present invention are described below with reference to the accompanying drawings.

Figure 1:
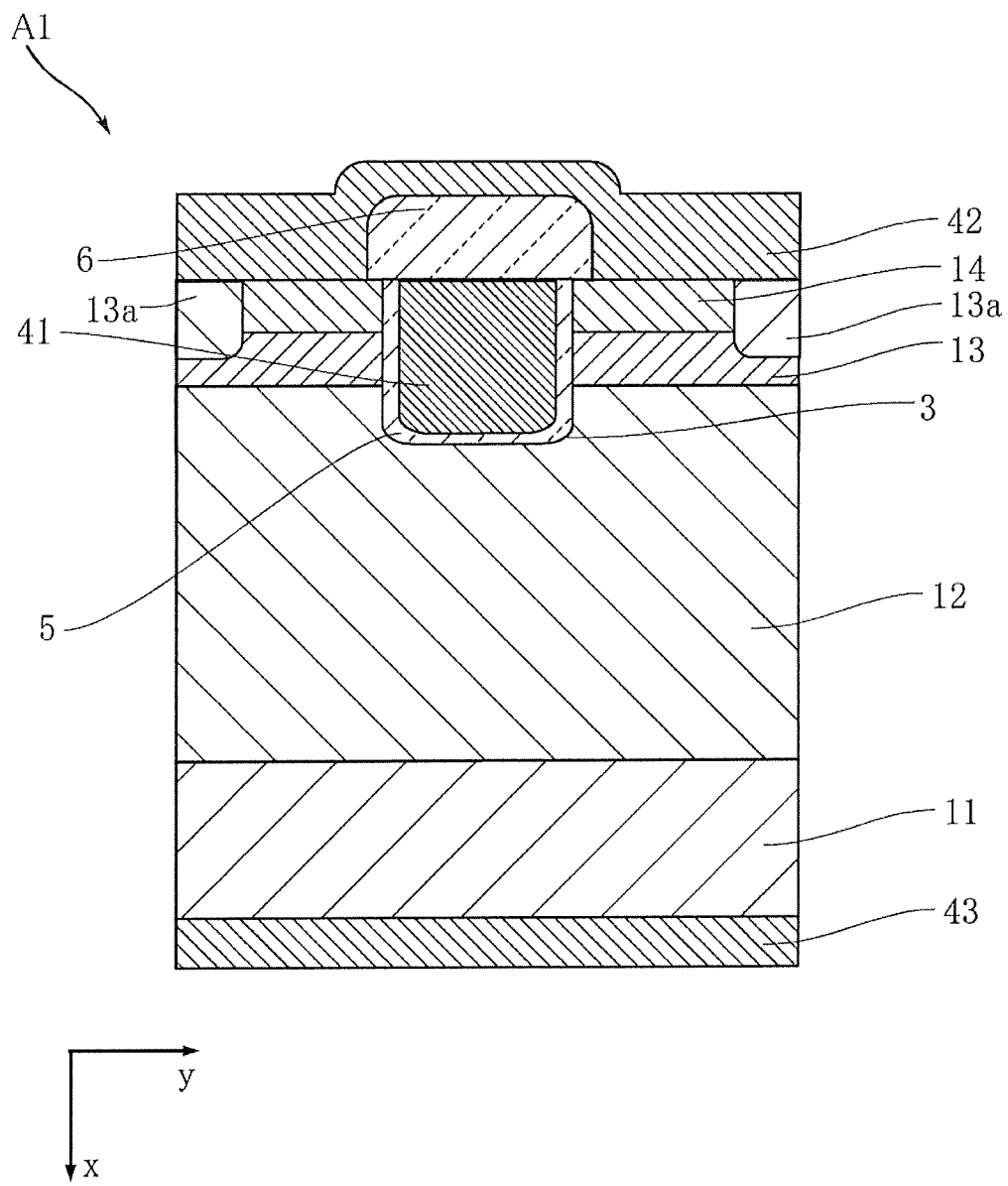
FIG. 1 is a sectional view showing a principal portion of a semiconductor device according to a first embodiment of the present invention.

FIG. 1 depicts a semiconductor device according to a first embodiment of the present invention. The semiconductor device A1 according to this embodiment includes a first n-type semiconductor layer 11, a second n-type semiconductor layer 12, a p-type semiconductor layer 13, a high-concentration p-type semiconductor region 13a, an n-type semiconductor region 14, a trench 3, a gate electrode 41, a gate insulating layer 5, a source electrode 42, a drain electrode 43 and an interlayer insulating film 6, and has what is known as trench MOSFET structure.

The first n-type semiconductor layer 11 is a substrate made of silicon carbide with high-concentration impurity added thereto, and serves as a base of the semiconductor device A1. The size of the first n-type semiconductor layer 11 in the depth direction x is approximately 300 μm. The impurity concentration in the first n-type semiconductor layer 11 is approximately $1\times10^{19}$ cm$^{-3}$.

The second n-type semiconductor layer 12 is formed on the first n-type semiconductor layer 11. The second n-type semiconductor layer 12 is made of silicon carbide with low-concentration impurity added thereto. The size of the second n-type semiconductor layer 12 in the depth direction x is approximately 10 μm. The impurity concentration of the second n-type semiconductor layer 12 is approximately $6\times10^{15}$ cm$^{-3}$. However, the impurity concentration of the second n-type semiconductor layer 12 is not limited to this and may be in a range of approximately $1\times10^{15}$ to $2\times10^{16}$ cm$^{-3}$.

The p-type semiconductor layer 13 is formed on the second n-type semiconductor layer 12. The size of the p-type semiconductor layer 13 in the depth direction x is approximately 0.3 μm. It is preferable that the size of the p-type semiconductor layer 13 in the depth direction is in a range of 0.1 to 0.5 μm. The impurity concentration of the p-type semiconductor layer 13 is $1\times10^{17}$ cm$^{-3}$ or higher.

The p-type semiconductor layer 13 includes a channel region. The channel region is along the trench 3 and in contact with the second n-type semiconductor layer 12 and the n-type semiconductor region 14. The size of the p-type semiconductor layer 13 in the depth direction x needs to be in a range that provides a short channel effect. The short channel effect refers to the phenomenon that a decrease in size of the channel region in the depth direction x leads to a lower threshold voltage of the semiconductor device A1. When the size of the p-type semiconductor layer 13 in the depth direction is smaller than 0.1 μm, the channel region may often fail to effectively perform its function.

Figure 2:
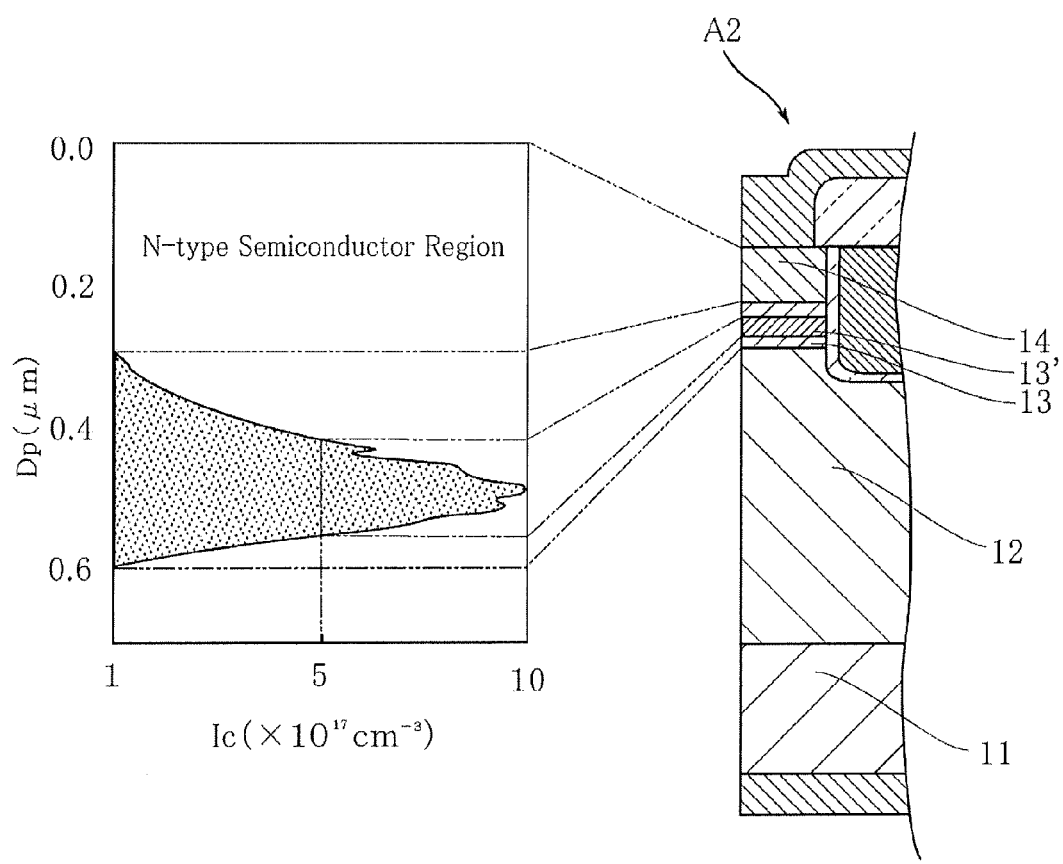
FIG. 2 is a diagram showing the distribution of impurity concentration in a depth direction, in a p-type semiconductor region of the semiconductor device shown in FIG. 1.

FIG. 2 shows the distribution of impurity concentration Ic in the depth direction x, in the p-type semiconductor layer 13. With an increase in depth Dp, the impurity concentration Ic becomes higher. The impurity concentration Ic is highest at a certain depth Dp, and becomes lower with a further increase in depth Dp. Specifically, the impurity concentration Ic is highest at the depth Dp of approximately 0.5 μm, and the value at this point is approximately $1\times10^{18}$ cm$^{-3}$. In order to attain a sufficient withstand voltage, it is preferable that the p-type semiconductor layer 13 includes a high-concentration region 13'. In the figure, the portion where the impurity concentration is $5\times10^{17}$ cm$^{-3}$ or higher is the high-concentration region 13'. When the size of the p-type semiconductor layer 13 exceeds 0.5 μm, it is difficult to create such impurity concentration distribution by e.g. impurity ion irradiation and to sufficiently exhibit the short channel effect.

The n-type semiconductor region 14 is formed on the p-type semiconductor layer 13. The size of the n-type semiconductor region 14 in the depth direction x is approximately 0.3 μm. The impurity concentration of the n-type semiconductor region 14 is approximately $1\times10^{20}$ cm$^{-3}$. However, the impurity concentration of the n-type semiconductor region 14 is not limited to this, and it is only required that the impurity concentration is not lower than $1\times10^{18}$ cm$^{-3}$. The high-concentration p-type semiconductor region 13a is formed on the p-type semiconductor layer 13.

The trench 3 is formed so as to penetrate through the p-type semiconductor layer 13 and the n-type semiconductor region 14 to reach the second n-type semiconductor layer 12. The size of the trench 3 in the depth direction x is equal to or greater than that of the p-type semiconductor layer 13 in the depth direction x. In this embodiment, the size of the trench 3 in the depth direction x is approximately 1 μm.

Inside the trench 3, the gate electrode 41 and the gate insulating layer 5 are formed. The gate insulating layer 5 serves to insulate the gate electrode 41 from the second n-type semiconductor layer 12, the p-type semiconductor layer 13, and the n-type semiconductor region 14. The gate insulating layer 5 is formed on the inner surface of the trench 3 at the bottom and sides of the trench 3. In this embodiment, the gate insulating layer 5 is made of, for example, silicon dioxide.

The size of the side portion of the gate insulating layer 5 in the width direction y is approximately 0.1 μm. The size of the bottom portion of the gate insulating layer 5 in the direction x is approximately 0.08 μm.

The source electrode 42 is made of aluminum for example, and in contact with the n-type semiconductor region 14 and the high-concentration p-type semiconductor region 13a. The drain electrode 43 is made of aluminum for example, and in contact with the first n-type semiconductor layer 11. The drain electrode 43 is formed on the opposite side of the second n-type semiconductor layer 12 across the first n-type semiconductor layer 11. The interlayer insulating film 6 is formed so as to cover the gate electrode 41.

An example of a manufacturing method of the semiconductor device A1 is described below with reference to FIGS. 3 and 4.

Figure 3:
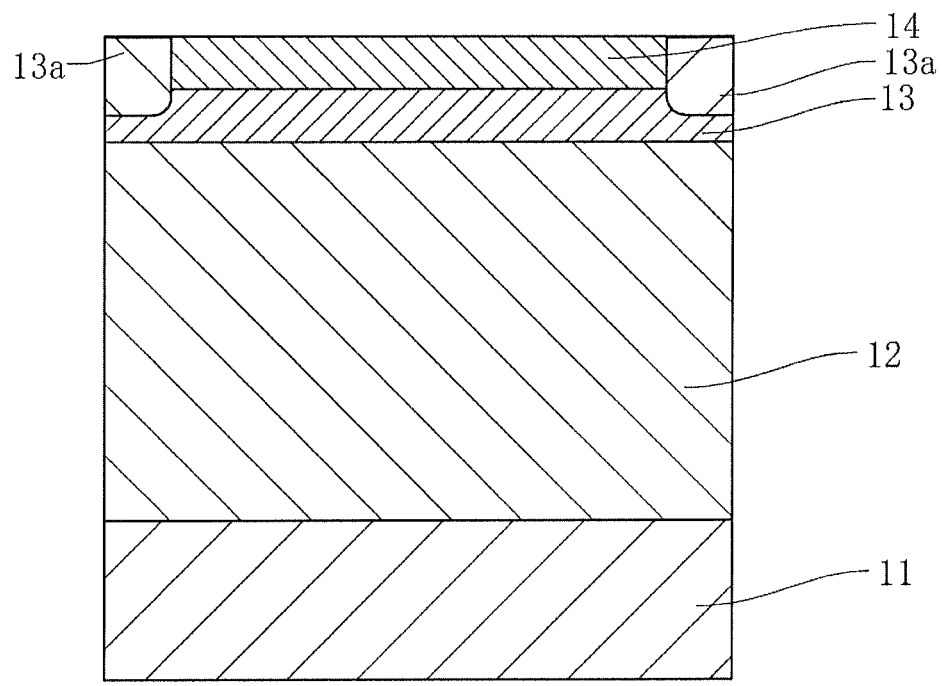
FIG. 3 is a sectional view showing a part of a manufacturing process of the semiconductor device shown in FIG. 1.

First, as shown in FIG. 3, a semiconductor substrate made of silicon carbide, which is to become the first n-type semiconductor layer 11, is prepared. Then, the second n-type semiconductor layer 12 is formed on the obverse surface of the substrate by epitaxial crystal growth. Then, impurity ions (p-type) such as aluminum ion or boron ion are implanted into the upper surface of the second n-type semiconductor layer 12 to thereby form the p-type semiconductor layer 13. The impurity ions implanted in the silicon carbide barely diffuses in the silicon carbide substrate. The location of the implanted impurity ion in the silicon carbide substrate in the depth direction exclusively depends on the irradiation energy. Accordingly, by adjusting the energy when implanting impurity ions, the impurity concentration distribution in the depth direction as that shown in FIG. 2 is provided. Then the n-type semiconductor region 14 and the high-concentration p-type semiconductor region 13a are formed, for example by implanting impurity ions (n-type or p-type).

Figure 4:
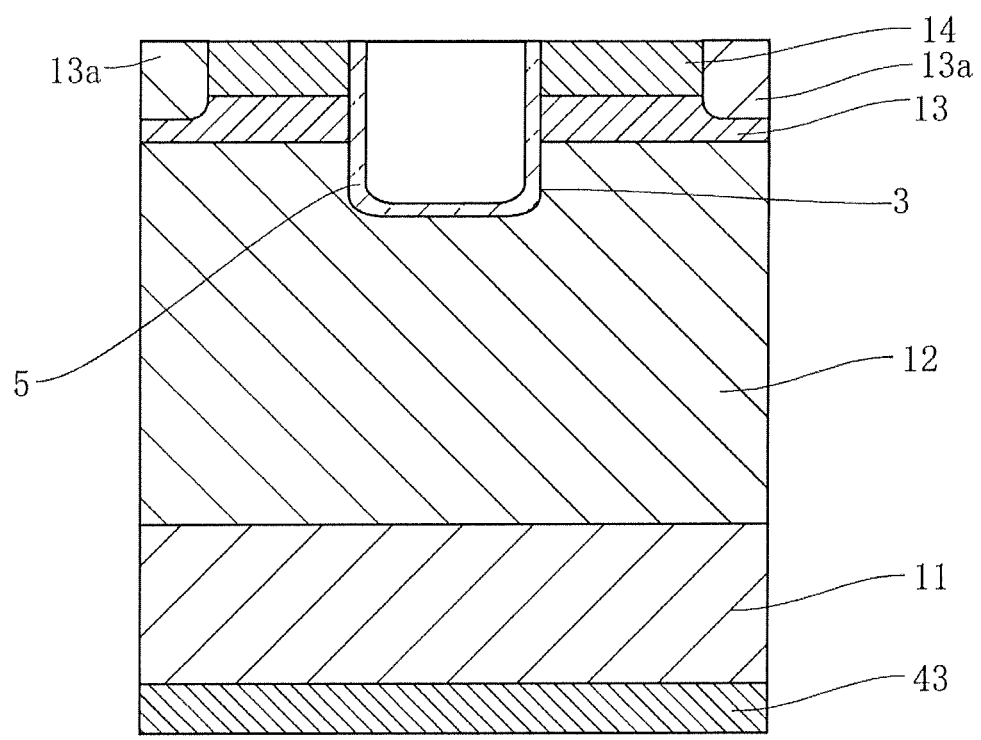
FIG. 4 is a sectional view showing a step of the manufacturing process following the step shown in FIG. 2.

Then, as shown in FIG. 4, the trench 3, the gate insulating layer 5 and the gate electrode 41 are formed. Thereafter, the interlayer insulating film 6, the source electrode 42 and the drain electrode 43 are formed. Through the foregoing process, the semiconductor device A1 shown in FIG. 1 is obtained.

A comparison is made below between the semiconductor device A1 according to the present invention and the conventional semiconductor device.

Figure 5:
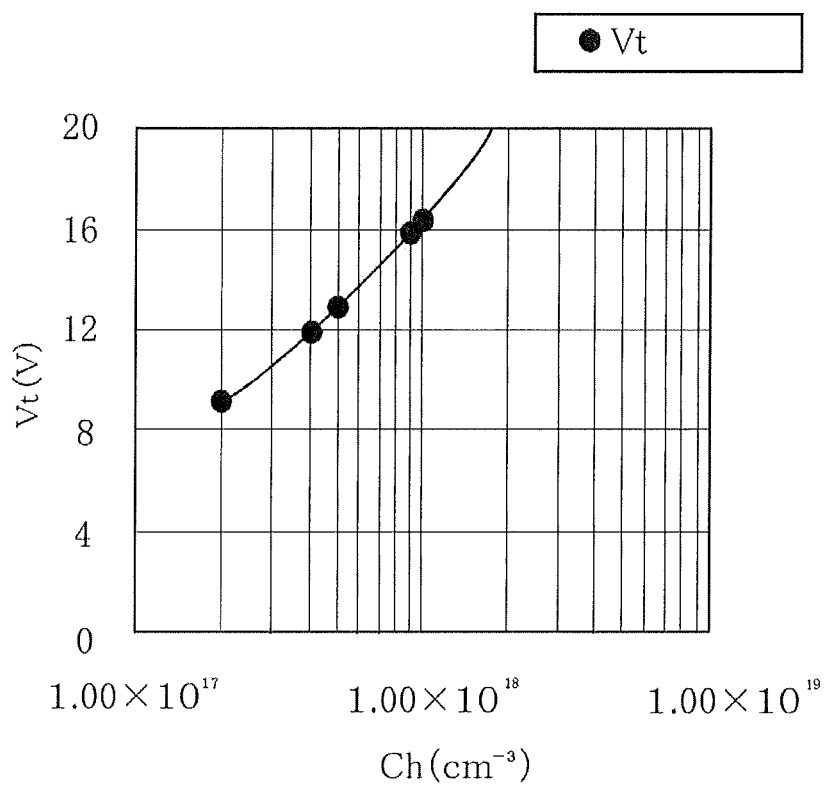
FIG. 5 is a graph showing a threshold voltage with respect to p-type semiconductor layer highest concentration in the conventional semiconductor device.
Figure 6A:
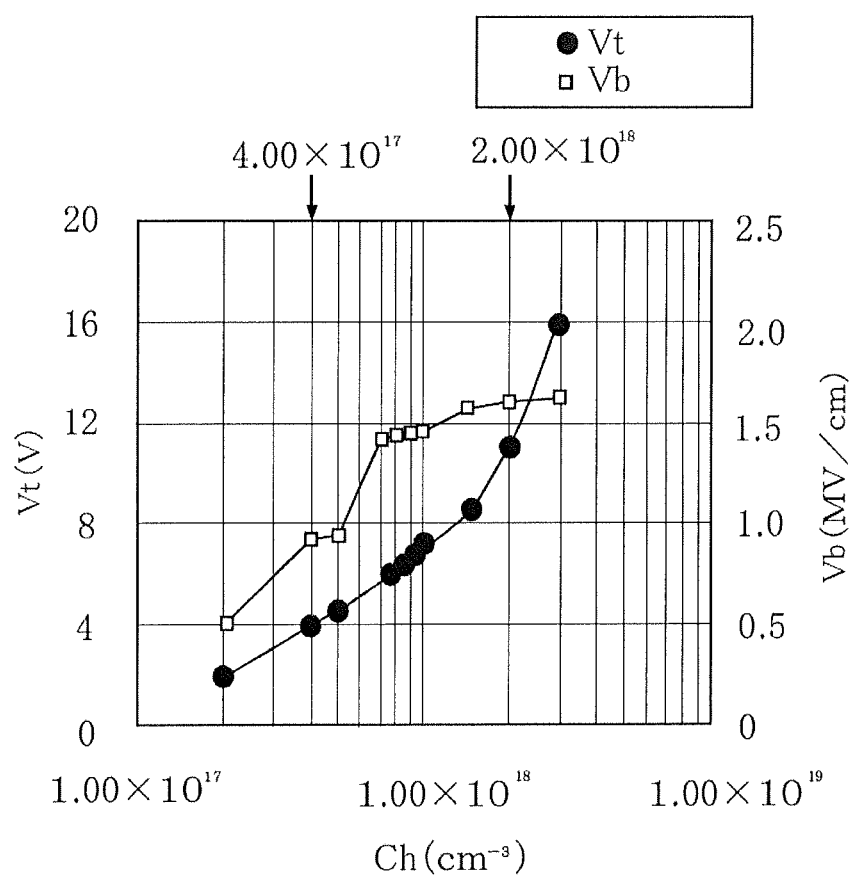
FIG. 6A is a graph showing the relationship of a threshold voltage and a dielectric breakdown field to a p-type semiconductor layer highest concentration in the embodiment.
Figure 6B:
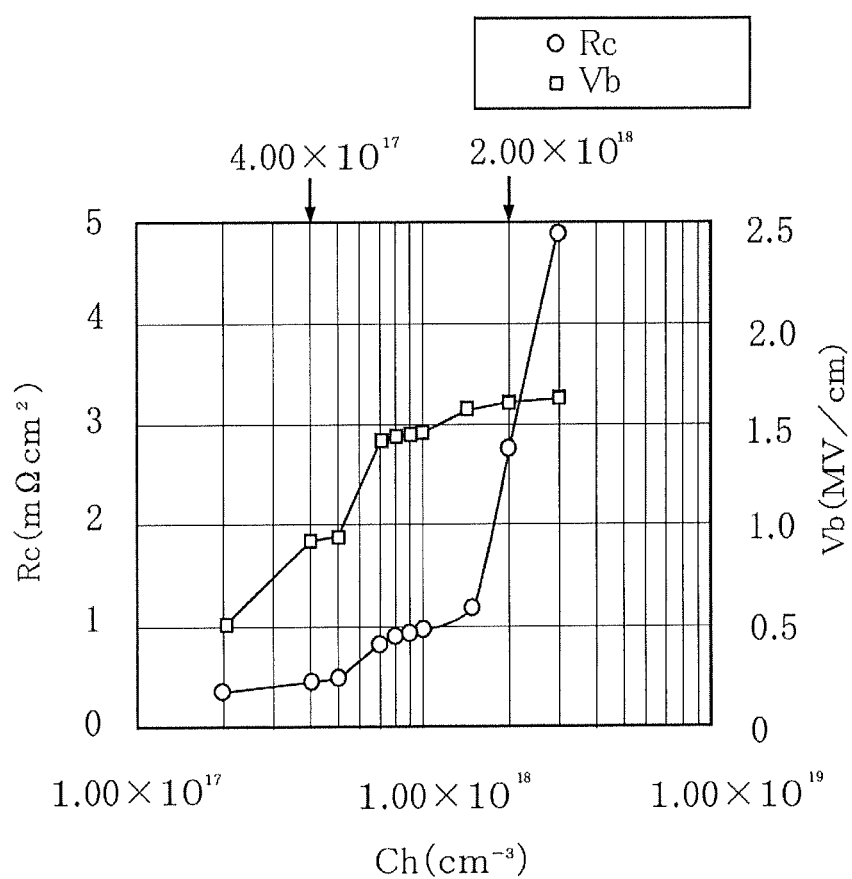
FIG. 6B is a graph showing the relationship of a channel resistance and a dielectric breakdown field to a p-type semiconductor layer highest concentration in the embodiment.

FIG. 5 shows the relationship between peak concentration of impurity in the p-type semiconductor layer (p-type semiconductor layer highest concentration Ch) and threshold voltage Vt in the conventional semiconductor device. In the conventional semiconductor device, the short channel effect is not provided and the threshold voltage is not affected by the size of the channel region in the depth direction x, which is the difference from the semiconductor device A1. FIG. 6A shows the relationship of threshold voltage Vt and dielectric breakdown field Vb to p-type semiconductor layer highest concentration Ch in the semiconductor device A1 according to this embodiment. FIG. 6B shows the relationship of channel resistance Rc and dielectric breakdown field Vb to p-type semiconductor layer highest concentration Ch in the semiconductor device A1 according to this embodiment.

According to FIG. 5, in the conventional semiconductor device 9A, when the highest impurity concentration Ch in the p-type semiconductor layer 913 is $2\times10^{17}$ cm$^{-3}$, the threshold voltage Vt is 9 V. In this state, the channel resistance is 3.8 mΩcm$^2$ provided that the channel length is 1 μm and the dielectric breakdown field Vb at a corner portion of the trench 93 is 1.5 MVcm$^{-1}$. When the highest impurity concentration Ch in the p-type semiconductor layer 913 is $5\times10^{17}$ cm$^{-3}$, the threshold voltage Vt is 13 V. In this state, the channel resistance is 5.9 mΩcm$^2$ under a condition similar to the above, i.e. provided that the channel length is 1 μm and the dielectric breakdown field Vb at the bottom portion of the trench 93 is 1.5 MVcm$^{-1}$.

In contrast, according to FIG. 6A, the threshold voltage Vt is in a range of 4 V to 11 V when the p-type semiconductor layer highest concentration Ch is in a range of $4\times10^{17}$ cm$^{-3}$ to $2\times10^{18}$ cm$^{-3}$. In this range of p-type semiconductor layer highest concentration Ch, the dielectric breakdown field Vb is in a range of 0.9 MVcm$^{-1}$ to 1.7 MVcm$^{-1}$. According to FIG. 6B, in this range of p-type semiconductor layer highest concentration Ch, the channel resistance Rc is in a range of 0.5 mΩcm$^2$ to 2.9 mΩcm$^2$.

Here, the values of threshold voltage Vt, dielectric breakdown field Vb and channel resistance Rc at several points in the above-described range of p-type semiconductor layer highest concentration Ch will be cited. According to FIGS. 6A and 6B, when the p-type semiconductor layer highest concentration Ch is $4\times10^{17}$ cm$^{-3}$, the threshold voltage Vt is 4 V. In this state, the dielectric breakdown field Vb is approximately 0.9 MVcm$^{-1}$, while the channel resistance Rc is 0.5 mΩcm$^2$. When the p-type semiconductor layer highest concentration Ch is $2\times10^{18}$ cm$^{-3}$, the threshold voltage Vt is 11 V. In this state, the dielectric breakdown field Vb is approximately 1.7 MVcm$^{-1}$, and the channel resistance Rc is 2.9 mΩcm$^2$. When the p-type semiconductor layer highest concentration Ch is $1\times10^{18}$ cm$^{-3}$, which is within the range of $4\times10^{17}$ cm$^{-3}$ to $2\times10^{18}$ cm$^{-3}$, the threshold voltage Vt is 7 V. In this state, the dielectric breakdown field Vb is approximately 1.5 MVcm$^{-1}$, and the channel resistance Rc is 1 mΩcm$^2$.

The foregoing values of threshold voltage Vt, dielectric breakdown field Vb and channel resistance Rc are compared with those of the conventional semiconductor device described above with reference to FIG. 5. In the semiconductor device A1, the threshold voltage Vt is maintained at a relatively low level. Presumably, this is because the short channel effect takes place despite that the impurity concentration in the p-type semiconductor layer 13 is set in the foregoing range. Also, the dielectric breakdown field Vb is maintained at a relatively high level. This can be construed as a result of the impurity concentration of the p-type semiconductor layer 13 remaining high. Further, the channel resistance Rc is relatively small. This can be construed as a result of the reduction in size of the channel region in the depth direction. In this way, the values of threshold voltage Vt, dielectric breakdown field Vb and channel resistance Rc of the semiconductor device A1 are in a desirable range as a whole. Consequently, the semiconductor device A1 allows achieving more desirable values of on-resistance, dielectric withstand voltage and threshold voltage than those of the conventional semiconductor device.

Figure 7:
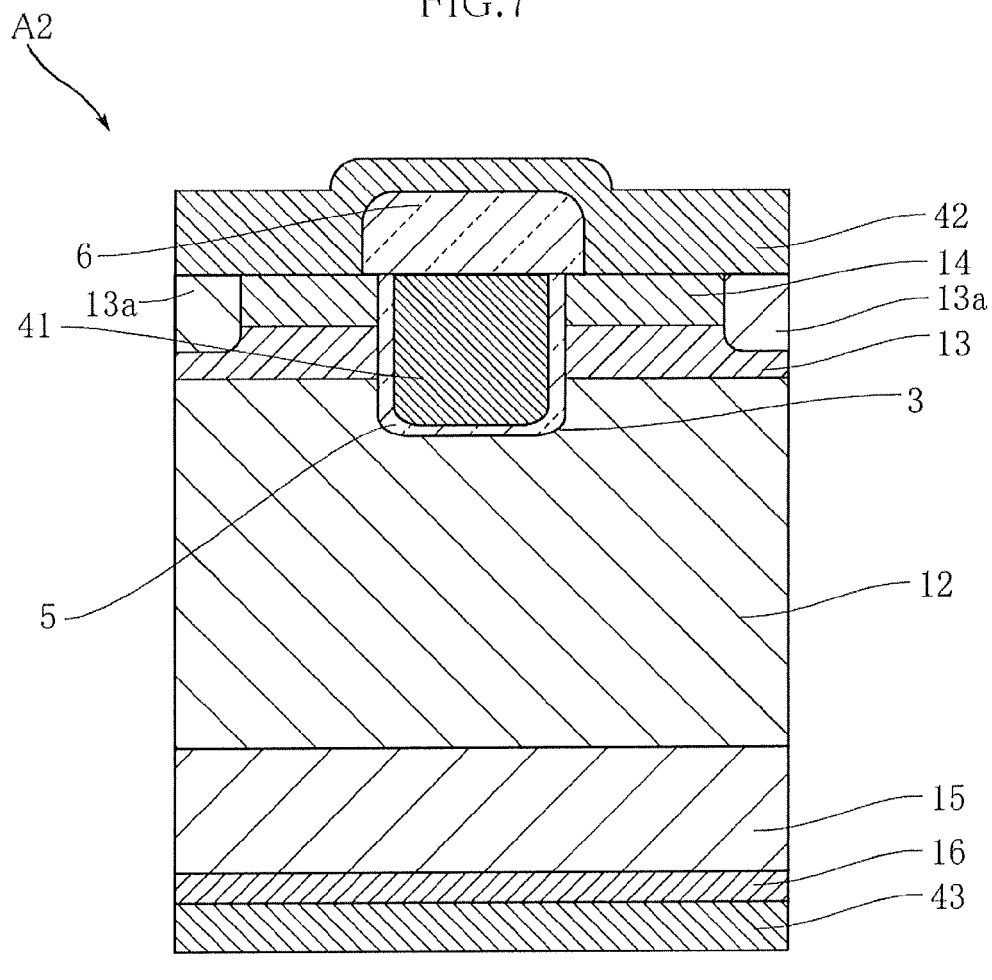
FIG. 7 is a sectional view showing a principal portion of a semiconductor device according to a second embodiment of the present invention.
Figure 8:
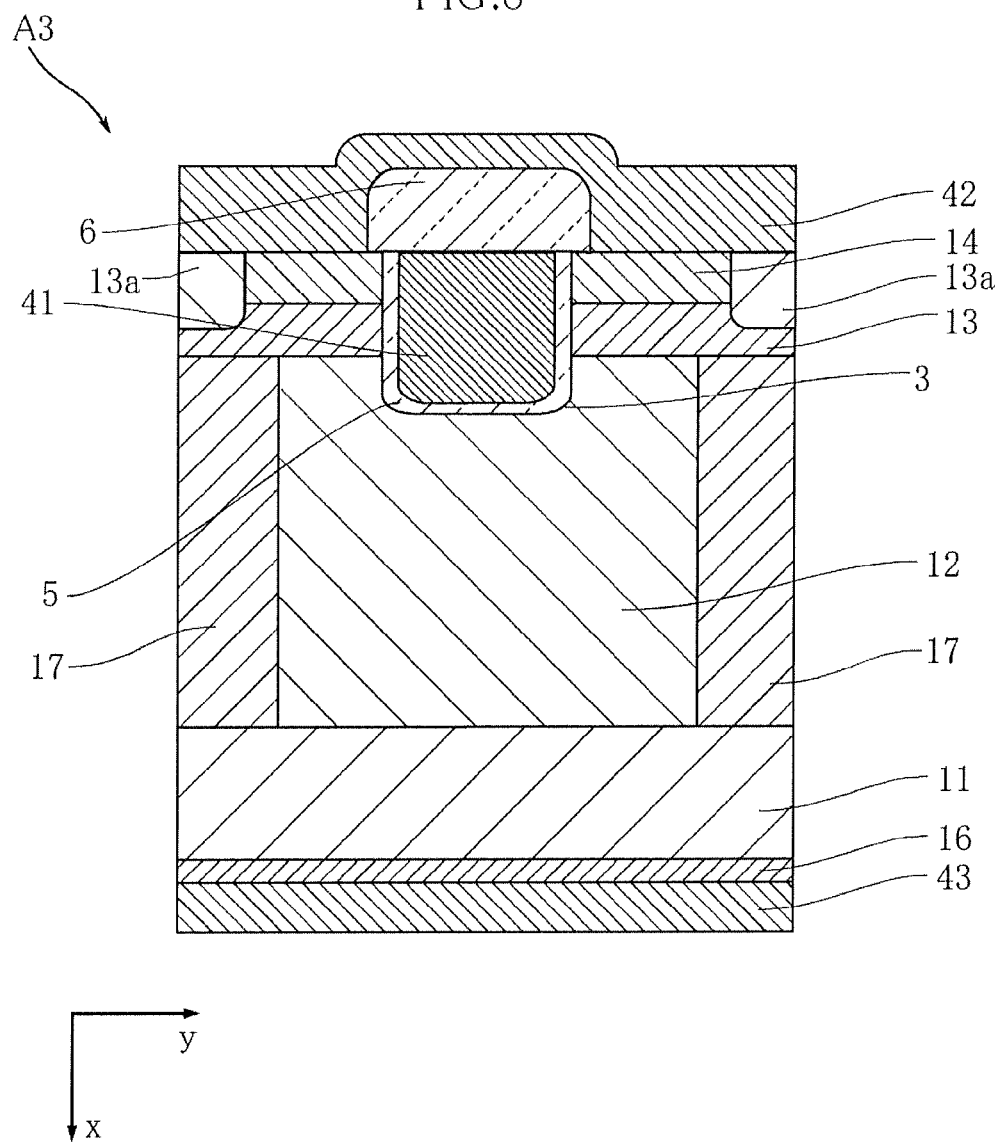
FIG. 8 is a sectional view showing a principal portion of a semiconductor device according to a third embodiment of the present invention.
Figure 9:
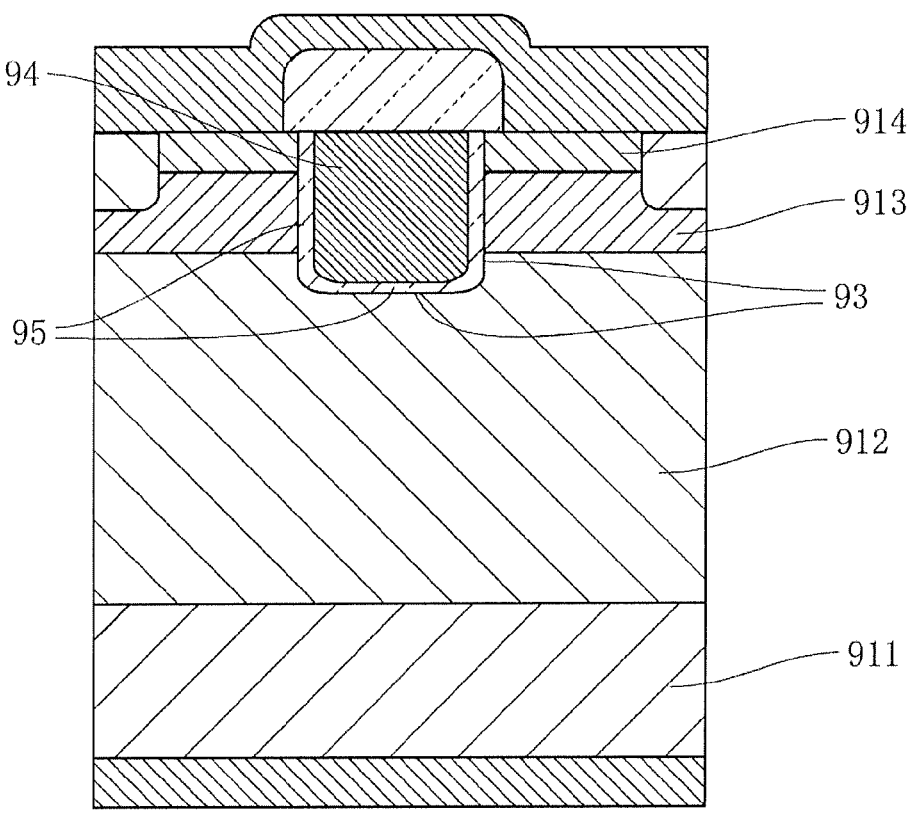
FIG. 9 is a sectional view showing a principal portion of a conventional semiconductor device.

FIGS. 7 and 8 each depict another example of the semiconductor device according to the present invention. In these figures, constituents similar to those of the foregoing embodiment are given the same reference signs, and the description thereof is appropriately omitted.

FIG. 7 shows a semiconductor device according to a second embodiment of the present invention. The semiconductor device A2 according to this embodiment is different from the semiconductor device A1 in having a structure of what is known as an IGBT (Insulated Gate Bipolar Transistor). The semiconductor device A2 is similar to the semiconductor device A1 in the size of the channel region and impurity concentration, as well as in including the high-concentration region 13' shown in FIG. 2 and being made of silicon carbide. In this embodiment, a p-type substrate 15 is provided on the back surface of the n-type semiconductor layer 12. Also, a nickel layer is provided between the p-type substrate 15 and the drain electrode 43.

This structure also allows, as does the semiconductor device A1, achieving relatively desirable values of on-resistance, dielectric withstand voltage and threshold voltage. Further, the semiconductor device A2 as an IGBT is advantageous for reducing the resistance, and hence more suitable for use under a high voltage than the semiconductor device A1.

FIG. 8 shows the semiconductor device according to a third embodiment of the present invention. The semiconductor device A3 according to this embodiment is different from the semiconductor device A1 in having a structure of what is known as an SJ (Super Junction) MOSFET. The semiconductor device A2 is similar to the semiconductor device A1 in the size of the channel region and impurity concentration, as well as in including the high-concentration region 13' shown in FIG. 2 and being made of silicon carbide.

In this embodiment, a p-type semiconductor layer 17 is formed to sandwich the n-type semiconductor layer 12 in the direction y. The p-type semiconductor layer 17 has generally the same thickness as the second n-type semiconductor layer 12, and is in contact with the first n-type semiconductor layer 11 and the p-type semiconductor layer 13. Between the first n-type semiconductor layer 11 and the drain electrode 43, a nickel layer 16 is provided. However, the structure is not limited to this, and the p-type semiconductor layer 17 may be formed along only halfway of the second n-type semiconductor layer 12 from the p-type semiconductor layer 13. In the semiconductor device A3 of the SJMOSFET structure, the first n-type semiconductor layer 11 serves as what is known as a drift layer, and the p-type semiconductor layer 17 as a RESURF layer.

Such structure also allows, as does the semiconductor device A1, achieving relatively desirable values of on-resistance, dielectric withstand voltage and threshold voltage. Further, the semiconductor device A3 as an SJMOSFET is advantageous for achieving both of a higher withstand voltage and a lower resistance.

The semiconductor device according to the present invention is in no way limited to the foregoing embodiments. Specific structure of the constituents of the semiconductor device according to the present invention may be varied in design in various manners.

The invention claimed is:

1. A semiconductor device comprising:
   a first semiconductor layer having a first conductivity type and made of silicon carbide;
   a second semiconductor layer made of silicon carbide, provided on the first semiconductor layer and having a second conductivity type opposite to the first conductivity type;
   a trench penetrating through the second semiconductor layer to reach the first semiconductor layer;
   an insulating layer formed at a bottom and a side of the trench along an inner surface of the trench;
   a gate electrode insulated by the insulating layer from the first semiconductor layer and the second semiconductor layer, at least part of the gate electrode being formed inside the trench; and
   a semiconductor region made of silicon carbide, having the first conductivity type and formed around the trench on the second semiconductor layer;
   wherein the second semiconductor layer includes a region that is along the trench,
   the region of the second semiconductor layer that is along the trench includes a high-concentration region where impurity concentration is equal to or higher than $5\times10^{17}$ cm$^{-3}$,
   the high-concentration region is in a form of a layer that is in contact with the trench and that spreads in a direction perpendicular to a depth direction of the trench, and
   the high-concentration region has a peak impurity region in a medium portion of the second semiconductor layer along the trench.

2. The semiconductor device according to claim 1, wherein a size of the second semiconductor layer in the depth direction of the trench is 0.1 to 0.5 μm, and
   a peak impurity concentration of the region of the second semiconductor layer that is along the trench is in a range of $7\times10^{17}$ cm$^{-3}$ to $1.5\times10^{18}$ cm$^{-3}$.

3. The semiconductor device according to claim 1, wherein the insulating layer includes a bottom portion and a side portion that are different in thickness from each other.

4. The semiconductor device according to claim 3, wherein the side portion of the insulating layer is thicker than the bottom portion of the insulating layer.

5. The semiconductor device according to claim 1, wherein an impurity concentration of the first semiconductor layer is in a range of $1\times10^{15}$ cm$^{-3}$ to $2\times10^{16}$ cm$^{-3}$.

6. The semiconductor device according to claim 1, wherein an impurity concentration of the second semiconductor layer is not less than $1\times10^{17}$ cm$^{-3}$.

7. The semiconductor device according to claim 1, wherein an impurity concentration of the semiconductor region is not less than $1\times10^{18}$ cm$^{-3}$.

8. The semiconductor device according to claim 1, wherein an impurity concentration of the second semiconductor layer initially increases, reaches a maximum at a predetermined depth and decreases, as proceeding from the semiconductor region toward the first semiconductor layer in the depth direction of the trench.

9. The semiconductor device according to claim 8, wherein a size of the second semiconductor layer in the depth direction of the trench is 0.1 to 0.5 μm, and
   a peak impurity concentration of the region of the second semiconductor layer that is along the trench is in a range of $7\times10^{17}$ cm$^{-3}$ to $1.5\times10^{18}$ cm$^{-3}$.

10. The semiconductor device according to claim 8, wherein the insulating layer includes a bottom portion and a side portion that are different in thickness from each other.

11. The semiconductor device according to claim 8, wherein an impurity concentration of the first semiconductor layer is in a range of $1\times10^{15}$ cm$^{-3}$ to $2\times10^{16}$ cm$^{-3}$.

12. The semiconductor device according to claim 8, wherein an impurity concentration of the semiconductor region is not less than $1\times10^{18}$ cm$^{-3}$.

13. The semiconductor device according to claim 8, wherein a position of the predetermined depth is closer to the first semiconductor layer than to the semiconductor region in the depth direction of the trench.

14. The semiconductor device according to claim 13, wherein a size of the second semiconductor layer in the depth direction of the trench is 0.1 to 0.5 μm, and
   a peak impurity concentration of the region of the second semiconductor layer that is along the trench is in a range of $7\times10^{17}$ cm$^{-3}$ to $1.5\times10^{18}$ cm$^{-3}$.

15. The semiconductor device according to claim 13, wherein the insulating layer includes a bottom portion and a side portion that are different in thickness from each other.

16. The semiconductor device according to claim 13, wherein an impurity concentration of the first semiconductor layer is in a range of $1\times10^{15}$ cm$^{-3}$ to $2\times10^{16}$ cm$^{-3}$.

17. The semiconductor device according to claim 13, wherein an impurity concentration of the semiconductor region is not less than $1\times10^{18}$ cm$^{-3}$.

18. The semiconductor device according to claim 1, configured as an insulated gate bipolar transistor.

19. The semiconductor device according to claim 1, configured as a super junction MOSFET.

20. The semiconductor device according to claim 1, wherein when a highest impurity concentration of the second semiconductor layer is in a range of $4\times10^{17}$ cm$^{-3}$ to $2\times10^{18}$ cm$^{-3}$, the semiconductor device has a threshold voltage in a range of 4 V to 11 V, a dielectric breakdown field in a range of 0.9 MVcm$^{-1}$ to 1.7 MVcm$^{-1}$, and a channel resistance in a range of 0.5 mΩcm$^2$ to 2.9 mΩcm$^2$.

* * * * *